(12) United States Patent
Tuers et al.

(10) Patent No.: US 9,400,747 B2
(45) Date of Patent: Jul. 26, 2016

(54) BATCH COMMAND TECHNIQUES FOR A DATA STORAGE DEVICE

(71) Applicant: SANDISK TECHNOLOGIES INC., Plano, TX (US)

(72) Inventors: Daniel Edward Tuers, Kapaa, HI (US); Abhijeet Manohar, Bangalore (IN); Mark Murin, Kfar-Saba (IL); Mark Shlick, Ganey-Tikva (IL); Menahem Lasser, Kohav-Yair (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 82 days.

(21) Appl. No.: 14/264,160

(22) Filed: Apr. 29, 2014

(65) Prior Publication Data

US 2015/0154112 A1 Jun. 4, 2015

Related U.S. Application Data

(60) Provisional application No. 61/910,857, filed on Dec. 2, 2013.

(30) Foreign Application Priority Data

Feb. 4, 2014 (IN) .............................. 519/CHE/2014

(51) Int. Cl.
| | | |
|---|---|---|
| G11C 29/00 | (2006.01) | |
| G06F 12/02 | (2006.01) | |
| G06F 13/16 | (2006.01) | |
| G06F 11/10 | (2006.01) | |
| G11C 11/56 | (2006.01) | |

(52) U.S. Cl.
CPC ........ *G06F 12/0246* (2013.01); *G06F 11/1072* (2013.01); *G06F 13/16* (2013.01); *G06F 2212/1016* (2013.01); *G06F 2212/7205* (2013.01); *G11C 11/5621* (2013.01); *G11C 2211/562* (2013.01); *G11C 2211/563* (2013.01)

(58) Field of Classification Search
CPC ............ G06F 11/1068; G06F 12/0246; G06F 11/1004; G06F 11/1048; G06F 11/1072; G06F 13/16; G06F 2212/1016
USPC .................................................. 714/764, 721
See application file for complete search history.

(56) References Cited

U.S. PATENT DOCUMENTS

| | | | | |
|---|---|---|---|---|
| 4,414,624 A | * | 11/1983 | Summer, Jr. ............ | G06F 13/36 712/21 |
| 7,376,810 B2 | | 5/2008 | Polizzi et al. | |
| 7,401,184 B2 | * | 7/2008 | Cabot ................. | G06F 12/0879 711/118 |
| 8,581,349 B1 | * | 11/2013 | Sekar ................ | H01L 29/78696 257/402 |
| 8,902,650 B2 | * | 12/2014 | Goldman ........... | G11C 11/5628 365/185.03 |
| 9,030,859 B2 | * | 5/2015 | Scheuerlein ....... | G11C 13/0002 365/130 |
| 9,116,781 B2 | * | 8/2015 | Vogelsang .............. | G06F 12/00 |
| 2005/0122767 A1 | * | 6/2005 | Perner .................... | G11C 11/16 365/158 |
| 2005/0285248 A1 | | 12/2005 | See et al. | |
| 2007/0109847 A1 | | 5/2007 | Cernea et al. | |
| 2014/0089764 A1 | * | 3/2014 | Goldman ............ | G06F 11/1048 714/773 |

* cited by examiner

*Primary Examiner* — David Ton

(74) *Attorney, Agent, or Firm* — Toler Law Group, PC

(57) ABSTRACT

A data storage device includes a non-volatile memory and a controller. A method includes sending a memory command from the controller to the non-volatile memory. The memory command indicates multiple sense operations to be performed at a single plane of the non-volatile memory.

19 Claims, 8 Drawing Sheets

BATCH COMMAND TECHNIQUES FOR A DATA STORAGE DEVICE

REFERENCE TO EARLIER-FILED APPLICATIONS

This application claims priority from U.S. Provisional Patent Application No. 61/910,857, filed Dec. 2, 2013, and from Indian Application No. 519/CHE/2014, filed Feb. 4, 2014. The contents of each of these applications are incorporated by reference herein in their entirety.

FIELD OF THE DISCLOSURE

The present application is generally related to data storage devices.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. Flash memory devices may include multiple dies that further increase storage capability. For example, a system-in-package (SiP) flash storage device may include multiple flash memory dies.

SUMMARY

As data storage density of a data storage device increases, a controller of the data storage device may perform more computations. The computations can in some cases slow performance of the data storage device, resulting in a poor user experience. For example, in a data storage device in which a controller interacts with multiple dies using a single bus, the controller may utilize a complex scheduling algorithm that schedules communications with the multiple dies to avoid collisions on the single bus. The scheduling algorithm may consume processing resources of the controller. Further, each communication on the single bus from a component of the data storage device may inhibit other components of the data storage device from using the single bus. As an example, a first die of the data storage device may be inhibited from accessing the shared bus while a second die of the data storage device is using the shared bus to communicate with the controller.

A batch command technique in accordance with the present disclosure may initiate multiple sense operations and/or multiple write operations using a single memory command sent from the controller to a non-volatile memory (e.g., to the first die or to the second die). The batch command technique may reduce a number of communications sent via the single bus by "bundling" multiple sense commands and/or multiple write commands into a single memory command. For example, in a particular embodiment, a fold operation (e.g., an operation to "fold" data from multiple physical pages to a single physical page) may be performed using a single memory command sent from the controller to the first die. Upon performing the fold operation, the first die may send a single response to the controller. Such a fold technique may reduce contention for the single bus by reducing a number of communications exchanged via the single bus, such as by bundling communications into a single memory command and/or a single response.

DETAILED DESCRIPTION

Figure 1:
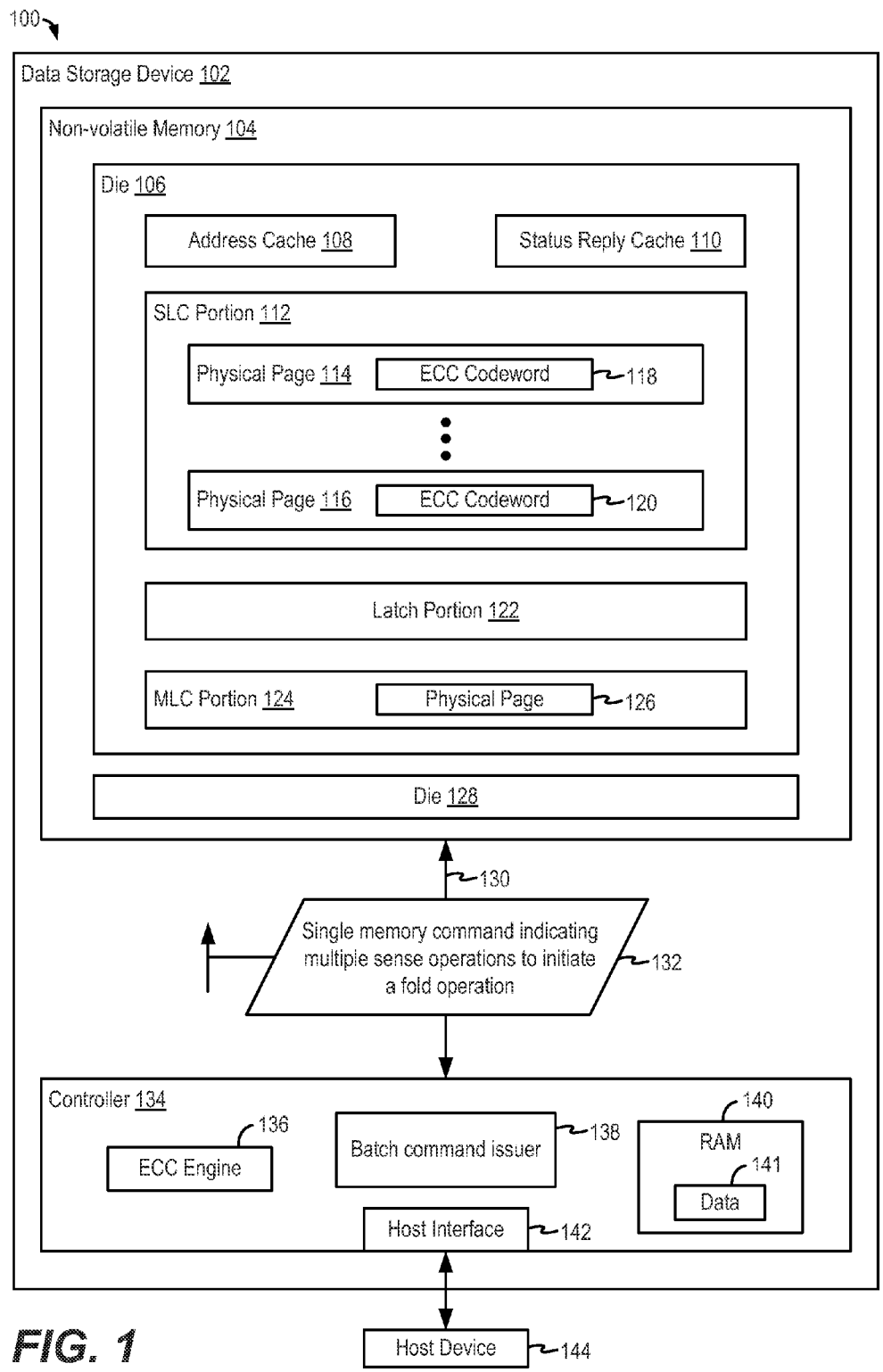
FIG. 1 is a block diagram of a particular illustrative embodiment of an electronic device including a data storage device having a particular operating state.

Referring to FIG. 1, a particular illustrative embodiment of an electronic device is depicted and generally designated 100. FIG. 1 illustrates a particular operating state of the electronic device 100.

The electronic device 100 includes a data storage device 102 and a host device 144. The data storage device 102 may be embedded within the host device 144, such as in accordance with an embedded MultiMedia Card (eMMC) configuration. Alternatively, the data storage device 102 may be removable from (i.e., removably coupled to) the host device 144. For example, the data storage device 102 may be removably coupled to the host device 144 in accordance with a removable universal serial bus (USB) configuration.

The data storage device 102 includes a non-volatile memory 104 and a controller 134. The non-volatile memory 104 includes a die 106 and a die 128. The die 106 may include an address cache 108, a status reply cache 110, a single-level cell (SLC) portion 112, a latch portion 122, and a multi-level cell (MLC) portion 124. Although not shown in FIG. 1, one of more components of the die 128 may be as described with reference to the die 106. For example, the die 128 may include an address cache, a status reply cache, an SLC portion, a latch portion, and an MLC portion. Further, the non-volatile memory 104 may include any number of dies (e.g., three or more).

The SLC portion 112 and the MLC portion 124 may include multiple physical pages. In the particular example shown in FIG. 1, the SLC portion 112 includes a physical page 114 and a physical page 116. The MLC portion 124 may include a physical page 126.

The controller 134 may include an error correcting code (ECC) engine 136, a batch command issuer 138, a random access memory (RAM) 140, and a host interface 142. The controller 134 may be coupled to the dies 106, 128 via a structure, such as a shared bus 130. In a particular illustrative embodiment, the batch command issuer 138 is configured to issue batch commands to the dies 106, 128 to reduce contention for the shared bus 130 between the controller 134 and the dies 106, 128. For example, the batch command issuer 138 may be configured to "group" together multiple sense commands and/or multiple write commands to reduce traffic at the shared bus 130.

The controller 134 may receive data and instructions from the host device 144 and may send data to the host device 144. As a particular example, the controller 134 may receive data 141 from the host device 144. In response to receiving the data 141 from the host device 144, the controller 134 may store the data 141 at the RAM 140. The host device 144 may instruct the data storage device 102 to store the data 141 at the non-volatile memory 104.

The ECC engine 136 may be configured to receive data and to generate a codeword based on the data. For example, the ECC engine 136 may include an encoder configured to encode the data 141 using an ECC encoding technique. The ECC engine 136 may include a Reed-Solomon encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The ECC engine may encode the data 141 to generate one or more ECC codewords, such as ECC codewords 118, 120.

The controller 134 may send data and commands to the non-volatile memory 104 and may receive data from the non-volatile memory 104. For example, the controller 134 is configured to send the ECC codewords 118, 120 and a write command to cause the non-volatile memory 104 to store data to one or more specified addresses of the non-volatile memory 104. As another example, the controller 134 is configured to send a read command to read data (e.g., the ECC codewords 118, 120) from one or more specified addresses of the non-volatile memory 104.

The ECC engine 136 may include a decoder configured to decode data read from the non-volatile memory 104 to detect and correct, up to an error correction capability of an ECC technique used by the ECC engine 136, bit errors that may be present in the data. For example, the ECC engine 136 may be configured to decode the ECC codewords 118, 120 to generate the data 141.

The host device 144 may correspond to a mobile telephone, a music player, a video player, a gaming console, an electronic book reader, a personal digital assistant (PDA), a computer, such as a laptop computer or notebook computer, another electronic device, or a combination thereof. The host device 144 may communicate via a host controller, which may enable the host device 144 to read data from the data storage device 102 and to write data to the data storage device 102. The host device 144 may operate in compliance with a JEDEC Solid State Technology Association industry specification, such as an embedded MultiMedia Card (eMMC) specification or a Universal Flash Storage (UFS) Host Controller Interface specification. The host device 144 may operate in compliance with one or more other specifications, such as a Secure Digital (SD) Host Controller specification as an illustrative example. The host device 144 may communicate with the data storage device 102 in accordance with another suitable communication protocol.

In operation, the controller 134 may initiate an operation, such as a fold operation to move data from the SLC portion 112 to MLC portion 124. The operation may include copying logical pages of data from multiple physical pages of the SLC portion 112 to a single physical page of the MLC portion 124. For example, the SLC portion 112 may correspond to a high speed cache portion of the non-volatile memory 104 where data may be cached until moved to the MLC portion 124. The controller 134 may initiate the operation to relocate data that is not frequently accessed to the MLC portion 124.

As an example, a fold operation may include copying data from the physical pages 114, 116 to the physical page 126. For example, the ECC codewords 118, 120 may be copied from the physical pages 114, 116 to the physical page 126. The controller 134 may initiate the fold operation by sending a single memory command 132 to the die 106 via the shared bus 130. The single memory command 132 may be generated by the batch command issuer 138 in response to determining that the fold operation is to be performed at the non-volatile memory 104.

The single memory command 132 indicates multiple sense operations to be performed at a single plane of the non-volatile memory 104. As used herein, a "plane" of the non-volatile memory 104 may refer to a portion of the non-volatile memory 104 that the controller 134 can write data to and/or erase data from simultaneously with (e.g., independently relative to) another portion of the non-volatile memory 104 (e.g., another plane of the non-volatile memory 104). A die, such as the die 106, may include a single plane or multiple planes. To further illustrate, in contradistinction to a multi-plane sense operation that senses data from multiple planes, a single memory command described herein may sense data from a single plane of the non-volatile memory 104.

The multiple sense operations may sense data, such as ECC codewords, from the SLC portion 112. As a particular example, the single memory command 132 may initiate a fold operation to copy the ECC codewords 118, 120 from the SLC portion 112 to the latch portion 122, as described further with reference to FIG. 2.

The single memory command 132 of FIG. 1 reduces congestion at the shared bus 130. For example, the single memory command 132 may initiate a fold operation using a single communication. Accordingly, traffic and congestion at the shared bus 130 is reduced as compared to a device in which a fold operation uses multiple distinct sense commands. The reduced traffic at the shared bus 130 enables less contention for the shared bus 130 between the controller 134 and the dies 106, 128. Further, the techniques of FIG. 1 may avoid use of a complex scheduling algorithm by the controller 134 (or may simplify an algorithm used by the controller 134) to coordinate communications on the shared bus 130.

Figure 2:
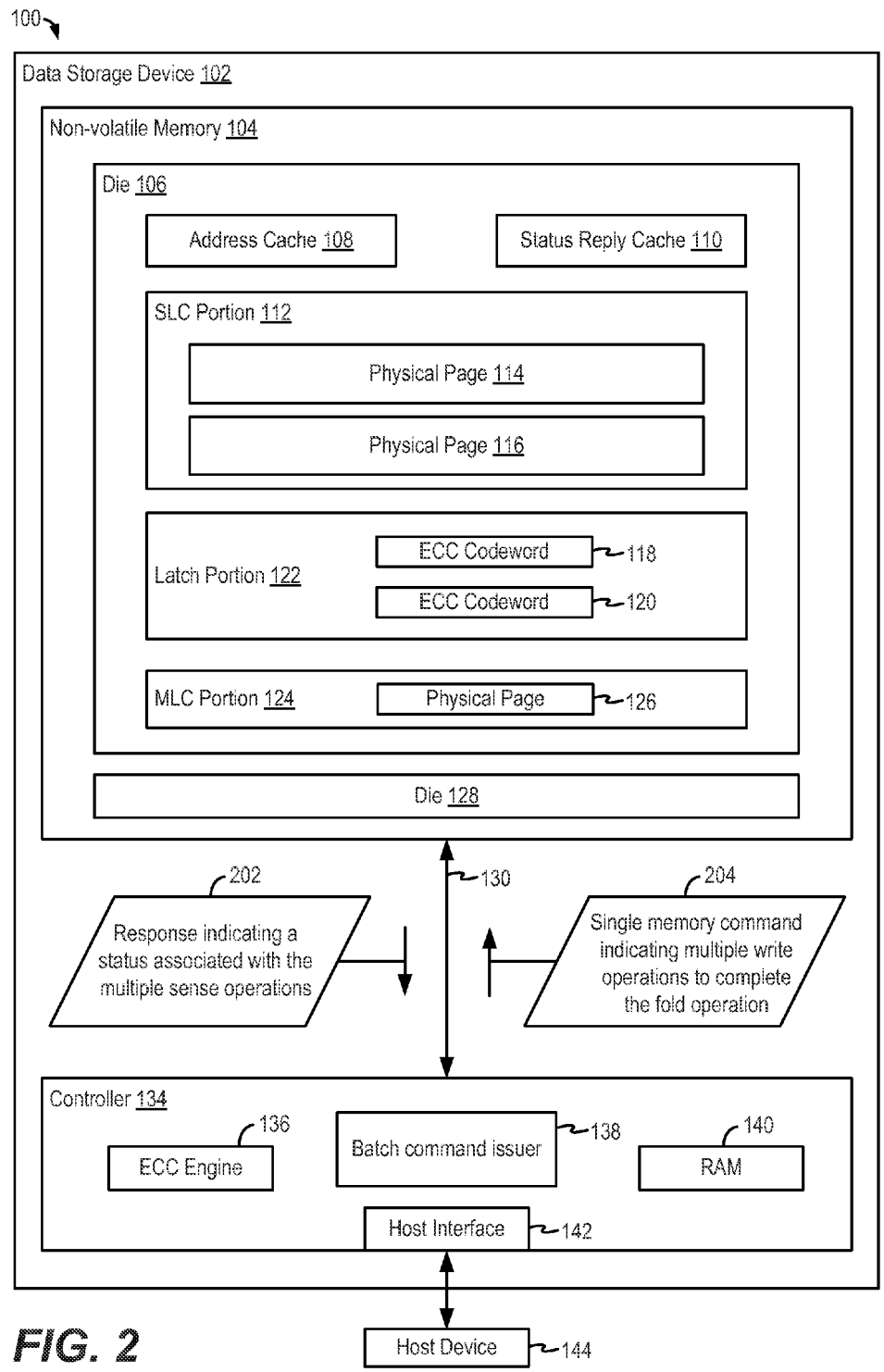
FIG. 2 is a block diagram of a particular illustrative embodiment of the electronic device of FIG. 1 where the data storage device has another particular operating state.

FIG. 2 depicts another operating state of the electronic device 100. In the operating state of FIG. 2, the ECC codewords 118, 120 have been copied to the latch portion 122, such as in response to the single memory command 132. In FIG. 2, the electronic device 100 includes the data storage device 102 and the host device 144. The data storage device 102 includes the non-volatile memory 104 and the controller 134. The non-volatile memory 104 and the controller 134 are coupled via the shared bus 130.

The non-volatile memory 104 includes the dies 106, 128. The die 106 includes the address cache 108, the status reply cache 110, the SLC portion 112, the latch portion 122, and the MLC portion 124. The SLC portion 112 includes the physical pages 114, 116. The MLC portion 124 includes the physical page 126. The controller 134 includes the ECC engine 136, the batch command issuer 138, the RAM 140, and the host interface 142.

In operation, the data storage device may latch the ECC codewords 118, 120 into the latch portion 122 responsive the single memory command 132 of FIG. 1. For example, FIG. 2 depicts that the ECC codewords 118, 120 have been copied from the physical pages 114, 116 of the SLC portion 112 to the latch portion 122.

Upon copying the ECC codewords 118, 120 to the latch portion 122, the non-volatile memory 104 may issue a response 202 via the shared bus 130. The response 202 may indicate a status associated with the multiple sense operations that copied the ECC codewords 118, 120 to the latch portion 122. As an example, the response 202 may indicate success or failure of one or more of the multiple sense operations (e.g., a pass or fail status of one or more of the multiple sense operations).

If the response 202 indicates success of the multiple sense operations that copy the ECC codewords 118, 120 to the latch portion 122, the controller 134 may issue a single memory command 204 to the die 106 via the shared bus 130. The single memory command 204 may indicate multiple write operations to complete a fold operation. For example, the single memory command 204 may instruct the die 106 to copy the ECC codewords 118, 120 from the latch portion 122 to the physical page 126 to complete the fold operation.

Alternatively, if the response 202 indicates failure of one or more of the multiple sense operations, the controller 134 may instruct the non-volatile memory 104 to retry the one or more failed sense operations (e.g., by sending another memory command to the non-volatile memory 104 via the shared bus 130). As another example, if the response 202 indicates failure of one or more of the multiple sense operations, the controller 134 may send a request to the non-volatile memory 104 requesting further details regarding the one or more failed sense operations, such as a location and/or cause of the failure (e.g., to collect data that may indicate whether a hardware failure has occurred at the non-volatile memory 104).

The response 202 and the single memory command 204 enable reduced congestion at the shared bus 130. For example, because the response 202 indicates a status associated with multiple sense operations, congestion at the shared bus 130 is reduced as compared to a data storage device that sends multiple responses indicating statuses associated with each of the multiple sense operations. As another example, because the single memory command 204 indicates multiple write operations, the single memory command 204 reduces congestion at the shared bus 130 as compared to a data storage device in which multiple write operations are indicated using multiple memory commands.

Figure 3:
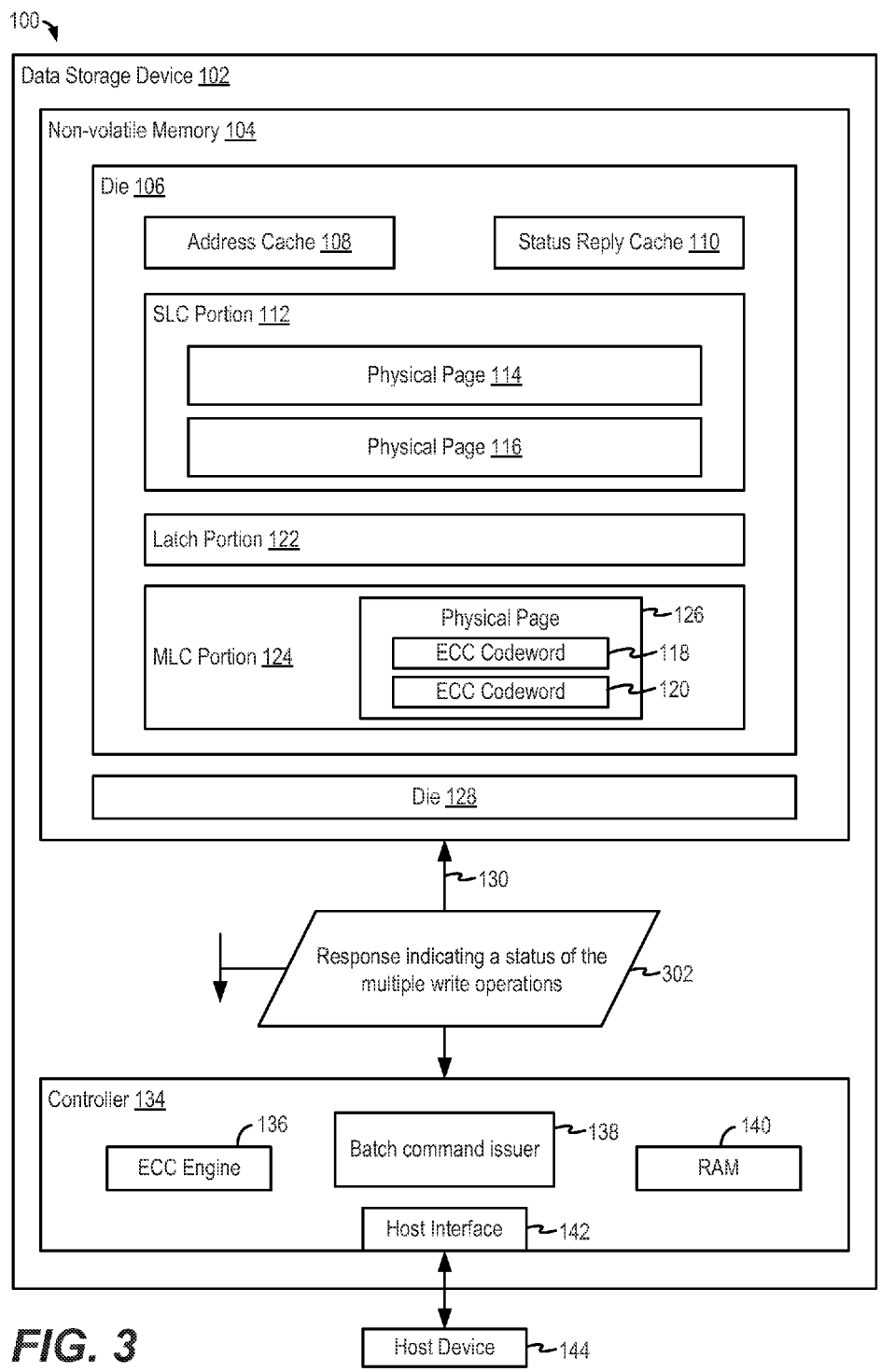
FIG. 3 is a block diagram of a particular illustrative embodiment of the electronic device of FIG. 1 where the data storage device has another particular operating state.

FIG. 3 depicts another operating state of the electronic device 100. In the operating state of FIG. 3, the ECC codewords 118, 120 have been copied to the MLC portion 124, such as in response to the single memory command 204. In FIG. 3, the electronic device 100 includes the data storage device 102 and the host device 144.

In operation, the ECC codewords 118, 120 may be copied from the latch portion 122 to the MLC portion 124, such as in response to the single memory command 204. In response to copying the ECC codewords 118, 120 to the MLC portion 124, the non-volatile memory 104 may issue a response 302. The response 302 may indicate a status of the multiple write operations that copy the ECC codewords 118, 120 from the latch portion 122 to the MLC portion 124. For example, the response 302 may indicate success or failure of the multiple write operations.

If the response 302 indicates success of the multiple write operations, the controller 134 may determine that the operation is successful, and the controller 134 may update a management table stored at the RAM 140 to indicate that the ECC codewords 118, 120 are stored at the physical page 126 (e.g., by updating the management table to indicate that an address of the physical page 126 is associated with valid data). The management table may be updated to indicate that the physical pages 114, 116 no longer store the ECC codewords 118, 120 (e.g., by updating the management table to indicate that addresses of the physical pages 114, 116 are not associated with valid data).

Alternatively, if the response 302 indicates failure of one or more of the multiple write operations, the controller 134 may instruct the non-volatile memory 104 to retry the one or more failed write operations (e.g., by sending another memory command to the non-volatile memory 104 via the shared bus 130). As another example, if the response 202 indicates failure of one or more of the multiple write operations, the controller 134 may send a request to the non-volatile memory 104 requesting further details regarding the one or more failed write operations, such as a location and/or cause of the failure (e.g., to collect data that may indicate whether a hardware failure has occurred at the non-volatile memory 104).

Because the response 302 indicates a status of the multiple write operations, traffic is reduced at the shared bus 130. For example, traffic at the shared bus 130 is reduced as compared to a data storage device in which multiple responses are sent via the shared bus 130 to indicate status of the multiple write operations.

Figure 4:
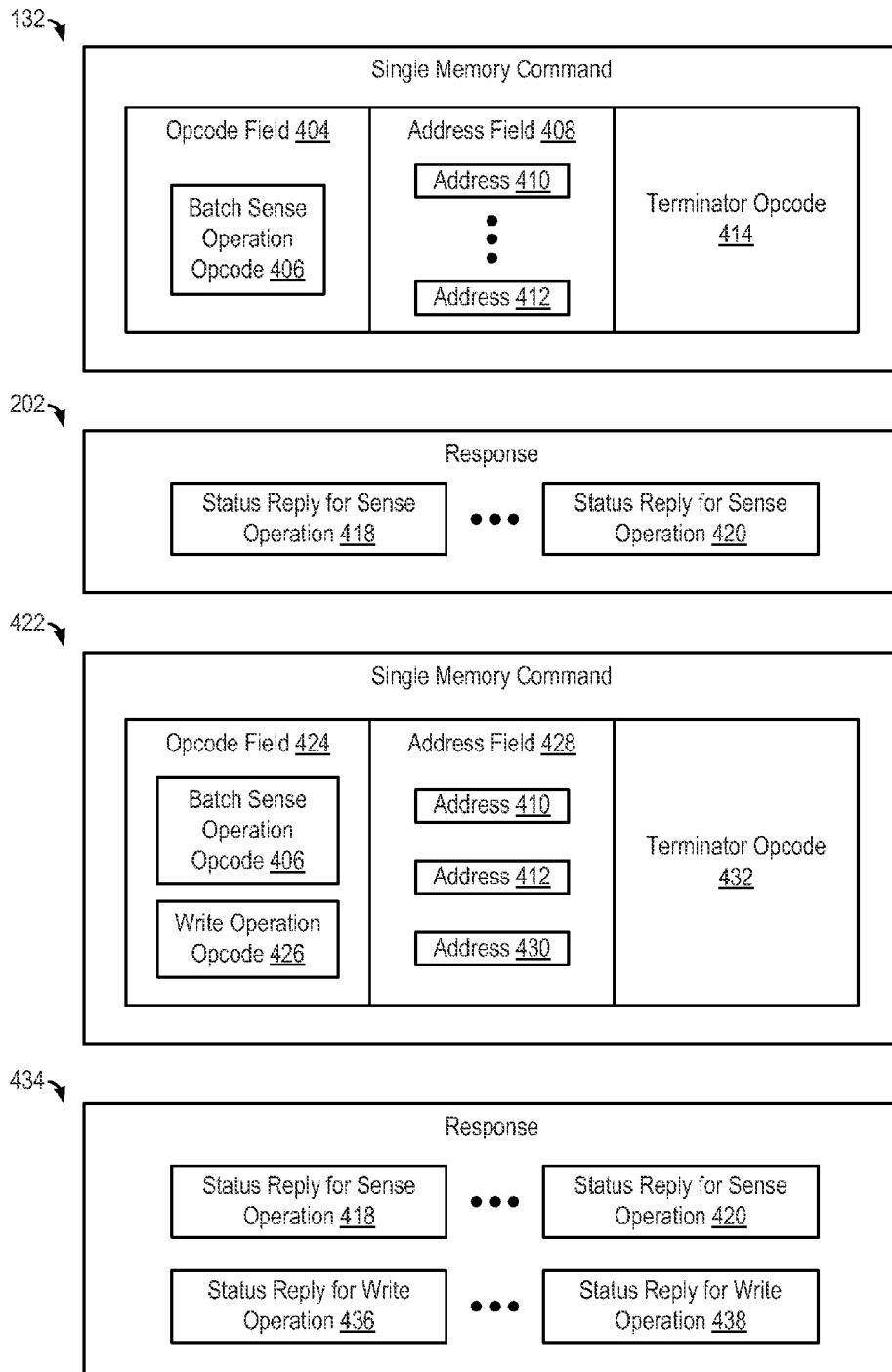
FIG. 4 illustrates communications that can be used by the data storage device of FIG. 1.

FIG. 4 illustrates communications that can be used by the data storage device 102 of FIG. 1. The communications include the single memory command 132, the response 202, a single memory command 422, and a response 434. The single memory commands 132, 422 may be sent by the controller 134 to either of the dies 106, 128 via the shared bus 130. The responses 202, 434 may be sent by either of the dies 106, 128 to the controller 134 via the shared bus 130.

The single memory command 132 may include an opcode field 404 (e.g., a header field). The opcode field 404 may include one or more opcodes. For example, the opcode field 404 may include a batch sense operation opcode 406. The batch sense operation opcode 406 may indicate that multiple addresses for multiple sense operations are to follow the opcode field 404.

Following the opcode field 404, the single memory command 132 may include an address field 408. The address field 408 may include multiple addresses for the batch sense operation. For example, the address field 408 may include an address 410 and an address 412. The address 410 may correspond to the physical page 114, and the address 412 may correspond to the physical page 116. The single memory command 132 may further include a terminator opcode 414 indicating an end of the single memory command 132.

In a particular embodiment, the addresses 410, 412 are stored at the address cache 108. Because the data storage device 102 is configured to initiate a batch sense operation indicated by the batch sense operation opcode 406, the addresses 410, 412 may be stored at the address cache 108 while each of the individual sense operations indicated by the batch sense operation opcode 406 is initiated. The storage of addresses in the address cache 108 is in contrast to certain conventional devices in which each individual sense operation is initiated using a separate memory command, and in which a non-volatile memory is configured to initiate each sense operation without caching addresses corresponding to the sense operation.

The response 202 may include a status reply 418 and a status reply 420. The status reply 418 may indicate a status of the sense operation that targets the address 410. For example, the status reply 418 may indicate whether the sense operation that copied the ECC codeword 118 from the physical page 114 to the latch portion 122 was successful or unsuccessful. The status reply 420 may indicate a status of a sense operation that targets the address 412. For example, the status reply 420 may indicate success or failure of the sense operation that copied the ECC codeword 120 from the physical page 116 to the latch portion 122.

In a particular embodiment, the status replies 418, 420 are cached at the status reply cache 110 until each sense operation indicated by the single memory command 132 is completed (e.g., instead of sending a first reply including the status reply 418 and a second reply including the status reply 420). Accordingly, a single response, such as the response 202, may be sent via the shared bus 130 (to avoid sending multiple responses indicating success or failure of each of the sense operations indicated by the single memory command 132).

In a particular embodiment, a single communication exchanged via the shared bus 130 can indicate multiple sense operations to move data into the latch portion 122 or multiple write operations to write the data from the latch portion 122 to the MLC portion 124. To illustrate, the single memory command 422 includes an opcode field 424 (e.g., a header field). The opcode field 424 includes a batch sense operation opcode 406 and a write operation opcode 426. The single memory command 422 may further include an address field 428. The address field 428 may indicate the addresses 410, 412. The address field 428 may further indicate an address 430. In a particular embodiment, the addresses 410, 412 correspond to the physical pages 114, 116, respectively. The address 430 may correspond to the physical page 126. The single memory command 422 may further include a terminator opcode 432 indicating an end of the single memory command 422.

The controller 134 may initiate a fold operation by sending the single memory command 422 to one of the dies 106, 128 via the shared bus 130. For example, the controller 134 may send the single memory command 422 instead of sending the single memory commands 132, 204. In a particular embodiment, the controller 134 sends the single memory command 422 instead of the single memory commands 132, 204 in response to a large amount of traffic at the shared bus 130.

To illustrate, the controller 134 may be configured to count communications that occur at the shared bus 130 within a particular time interval. If a number of communications at the shared bus 130 within the particular time interval satisfies a threshold number of communications, then the controller 134 may initiate the fold operation using the single memory command 422 instead of the single memory commands 132, 204. If the number of communications at the shared bus 130 within the particular time interval does not satisfy the threshold number of communications, then the controller 134 may initiate the fold operation using the single memory commands 132, 204 instead of the single memory command 422.

Use of the single memory commands 132, 204 instead of the single memory command 422 may be advantageous in certain circumstances, such as when a free storage space of the address cache 108 and the status reply cache 110 is insufficient to store the addresses 410, 412, and 430 and the status replies 418, 420, 436, and 438 (e.g., due to storage space consumed due to another communication from the controller 134). In this case, the controller 134 may "divide" the single memory command 422 into the single memory commands 132, 204 to prevent or reduce overflow at the address cache 108 and/or at the status reply cache 110.

The die 106 may send the response 434 to the controller 134 via the shared bus 130 in response to the single memory command 422. The response 434 may include statuses of multiple sense operations and statuses of multiple write operations. For example, the response 434 may include the status reply 418 and the status reply 420. The response 434 may further include a status reply 436 and a status reply 438. The status reply 418 may indicate success or failure of the sense operation to copy the ECC codeword 118 from the physical page 114 to the latch portion 122. The status reply 420 may indicate success or failure of the sense operation to copy the ECC codeword 120 from the physical page 116 to the latch portion 122, and the status reply 436 may indicate success or failure of the write operation to write the ECC codeword 118 from the latch portion 122 to the MLC portion 124. The status reply 438 may indicate success or failure of the write operation to copy the ECC codeword 120 from the latch portion 122 to the physical page 126.

In a particular embodiment the status replies 418, 420, 436, 438 are stored at the status reply cache 110 until the fold operation is completed (and until the response 434 is sent to the controller 134). Further, the addresses 410, 412, 430 may be stored at the address cache 108 while the sense operations and write operations are performed (and until the response 434 is sent to the controller 134).

The die 106 may complete a fold operation by sending the response 434 instead of the responses 202, 302 when a large amount of traffic is present at the shared bus 130. To illustrate, the die 106 may be configured to count communications that occur at the shared bus 130 within a particular time interval. If a number of communications at the shared bus 130 within the particular time interval satisfies a threshold number of communications, then the die 106 may complete the fold operation using the response 434 instead of responses 202, 302. If the number of communications at the shared bus 130 within the particular time interval does not satisfy the threshold number of communications, then the die 106 may complete the fold operation using the responses 202, 302 instead of the response 434.

Use of the responses 202, 302 instead of the response 434 may be advantageous in certain circumstances, such as when a free storage space of the address cache 108 and the status reply cache 110 is insufficient to store the addresses 410, 412, and 430 and the status replies 418, 420, 436, and 438 (e.g., due to storage space consumed due to another communication from the controller 134). In this case, the die 106 may "divide" the response 434 into the responses 202, 302 to prevent or reduce overflow at the address cache 108 and/or at the status reply cache 110.

The communications described with reference to FIG. 4 enable reduced traffic at the shared bus 130. For example, by issuing the response 434 to the controller 134 via the shared bus 130, multiple communications can be merged into a single response. In particular, in the example of FIG. 4, communications may be stored at the address cache 108 and/or at the status reply cache 110 until the fold operation is completed (and until the response 434 is sent to the controller 134).

It should be appreciated that the communications described with reference to FIG. 4 are illustrative and that the single memory commands 132, 422 and the responses 202, 434 may include information not shown in FIG. 4. For example, the single memory commands, 132, 422 may indicate a first set of read thresholds for sensing the ECC codeword 118 and a second set of read thresholds for sensing the ECC codeword 120, such as if threshold voltages stored at the physical page 114 are different than threshold voltages stored the physical page 116 (e.g., due to charge leakage, or another effect at the non-volatile memory 104). Further, although two ECC codewords (i.e., the ECC codewords 118, 120) are described herein for convenience of illustration, the techniques described herein are applicable to other configurations. As a particular example, in a particular embodiment, the SLC portion 112 may include three physical pages storing three ECC codewords that are copied to a single physical page, such as the physical page 126 of the MLC portion 124. Such an example may correspond to a three-bit-per-cell ("X3") configuration.

Figure 5:
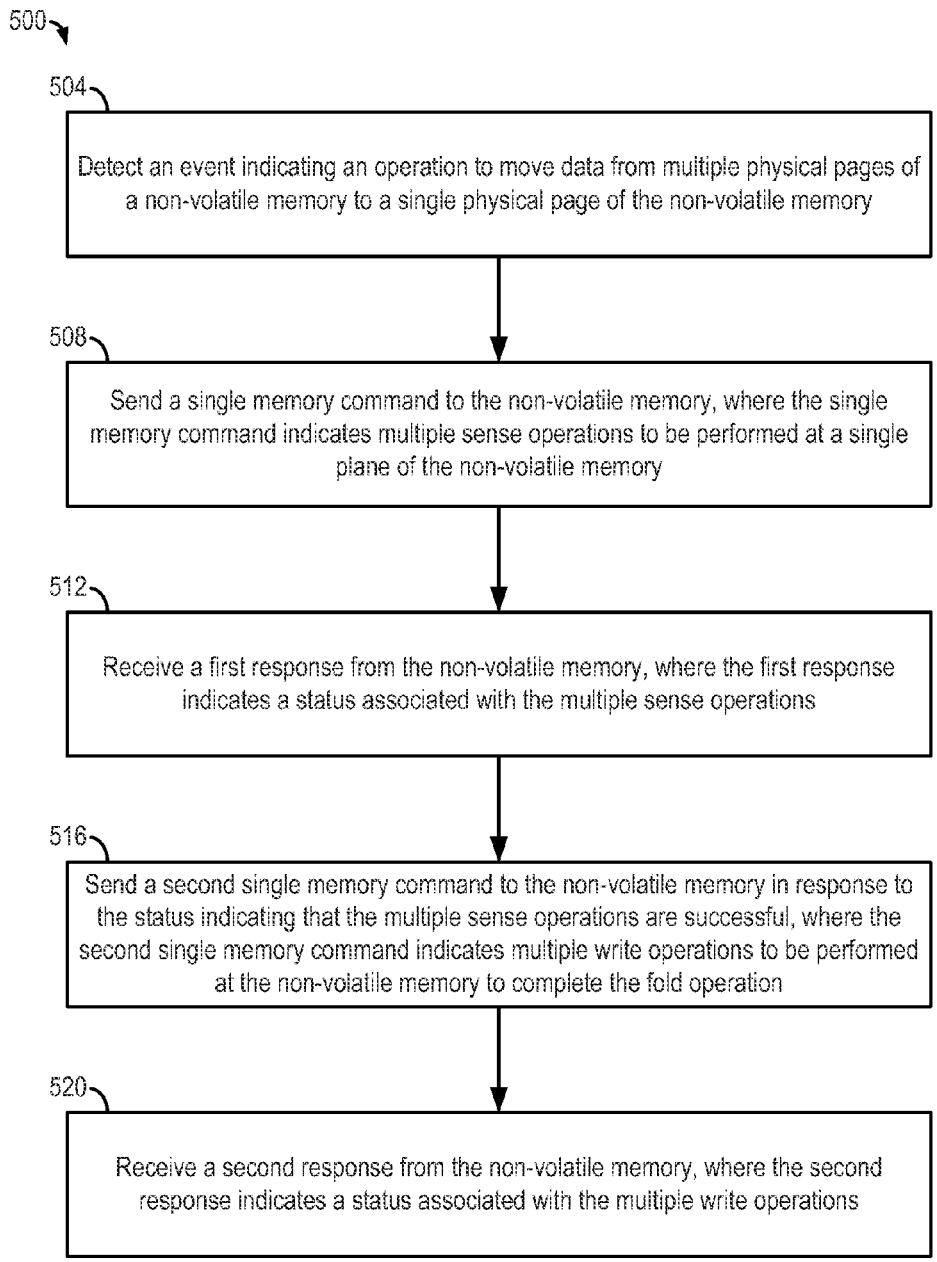
FIG. 5 is a flow diagram of a particular illustrative embodiment of a method of operation of the data storage device of FIG. 1.

Referring to FIG. 5, a particular illustrative embodiment of a method is depicted and generally designated 500. The method 500 may be performed by the data storage device 102, such as by the controller 134. The method 500 may be performed using the single memory commands 132, 204 and the responses 202, 302. In a particular embodiment, the method 500 is performed when a number of communications at the shared bus 130 during a particular time interval does not satisfy a threshold and/or when an available storage space at the address cache 108 and/or the status reply cache 110 does not satisfy a threshold.

The method 500 may include detecting an event indicating an operation to move data from multiple physical pages of a non-volatile memory to a single physical page of the non-volatile memory, at 504. The data may correspond to the ECC codewords 118, 120. The non-volatile memory may correspond to the non-volatile memory 104. In a particular embodiment, the operation is a fold operation that "folds" the data by relocating the data from the multiple physical pages to the single physical page. The fold operation may relocate data that has been temporarily cached at the SLC portion 112. The fold operation may be initiated by the controller 134 based on an available storage space of the SLC portion 112. As an illustrative example, if the available storage space at the SLC portion 112 fails to satisfy a threshold, the controller 134 may initiate the fold operation to relocate data from the SLC portion 112 to the MLC portion 124 to increase an amount of available storage space at the SLC portion 112.

The method 500 may further include sending a single memory command to the non-volatile memory, at 508. The single memory command may indicate multiple sense operations to be performed at a single plane of the non-volatile memory. The single memory command may correspond to the single memory command 132. The single memory command may be sent via the shared bus 130.

The method 500 may further include receiving a first response from the non-volatile memory, at 512. The first response may indicate a status associated with the multiple sense operations. For example, the first response may correspond to the response 202, and the response may include the status replies 418, 420.

The method 500 may further include sending a second single memory command to the non-volatile memory in response to the status indicating that the multiple sense operations are successful, at 516. The second single memory command may correspond to the single memory command 204. The second single memory command may indicate multiple write operations to be performed at the non-volatile memory to complete the fold operation. For example, the multiple write operations may instruct the non-volatile memory 104 to copy the ECC codewords 118, 120 from the latch portion 122 to the physical page 126. Alternatively, if the first response indicates that the multiple sense operations are unsuccessful, the controller 134 may send another memory command instructing the non-volatile memory 104 to retry the multiple sense operations.

The method 500 may further include receiving a second response from the non-volatile memory, at 520. The second response indicates a status associated with the multiple write operations. For example, the second response may correspond to the response 302. The second response may confirm that the ECC codewords 118, 120 have been written to a single physical page, such as the physical page 126, to complete the fold operation.

The method 500 of FIG. 5 enables reduced congestion at a shared resource, such as the shared bus 130. For example, because a single memory command instructs the non-volatile memory to perform multiple sense operations and a second single memory command instructs the non-volatile memory to perform multiple write operations, traffic at the shared bus 130 is reduced as compared to a technique that sends multiple memory commands for the multiple sense operations and multiple memory commands for the multiple write operations.

Figure 6:
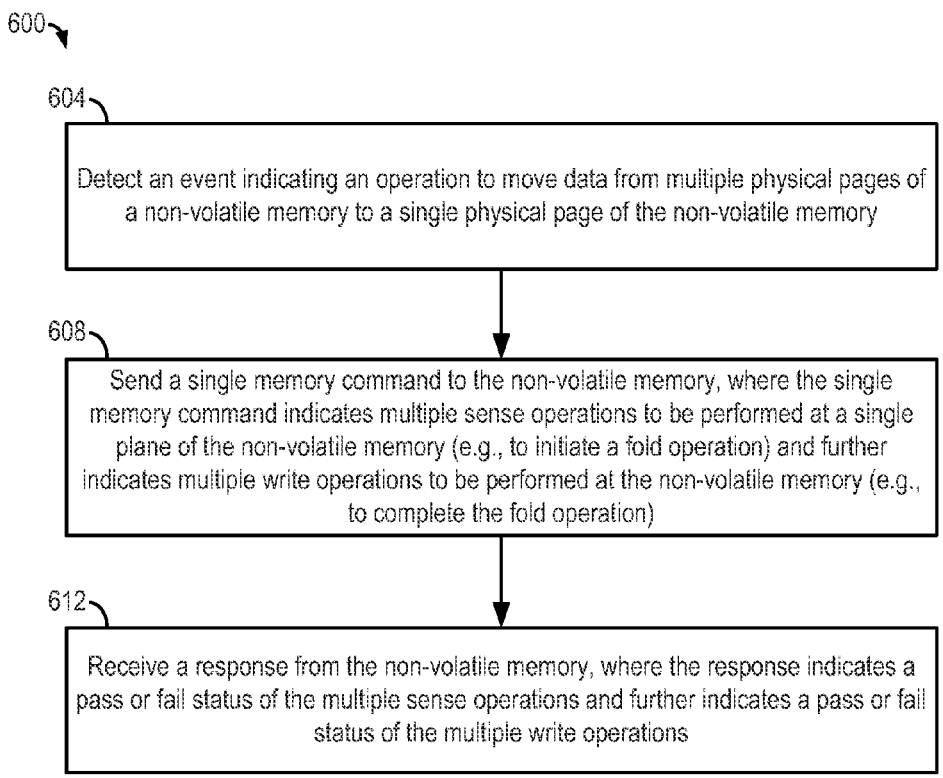
FIG. 6 is a flow diagram of a particular illustrative embodiment of another method of operation of the data storage device of FIG. 1.

Referring to FIG. 6, a particular illustrative embodiment of a method is depicted and generally designated 600. The method 600 may be performed by the data storage device 102, such as by the controller 134. The method 600 may be performed using the single memory command 422 and the response 434. In a particular embodiment, the method 600 is performed when a number of communications at the shared bus 130 during a particular time interval satisfies a threshold and/or when an available storage space at the address cache 108 and/or the status reply cache 110 satisfies a threshold.

The method 600 may include detecting an event indicating an operation to move data from multiple physical pages of a non-volatile memory to a single physical page of the non-volatile memory, at 604. The data may correspond to the ECC codewords 118, 120. The multiple physical pages may correspond to the physical pages 114, 116, and the single physical page may correspond to the physical page 126.

The method 600 may further include sending a single memory command to the non-volatile memory, at 608. The single memory command may correspond to the single memory command 422. The single memory command indicates multiple sense operations to be performed at a single plane of the non-volatile memory (e.g., to initiate a fold operation). The single memory command further indicates multiple write operations to be performed at the non-volatile memory. For example, the multiple write operations may be performed to compete the fold operation.

The method 600 may further include receiving a response from the non-volatile memory, at 612. The response may indicate a pass or fail status of the multiple sense operation and may further indicate a pass or fail status of the multiple write operations. For example, the response may correspond to the response 434. The response may include the status replies 418, 420, 436, 438.

The method 600 of FIG. 6 enables the data storage device 102 to perform a fold operation using reduced communications at the shared bus 130. For example, the method 600 illustrates that a fold operation can be performed at a data storage device by sending a single memory command to a non-volatile memory and by receiving a single response from the non-volatile memory.

Figure 7:
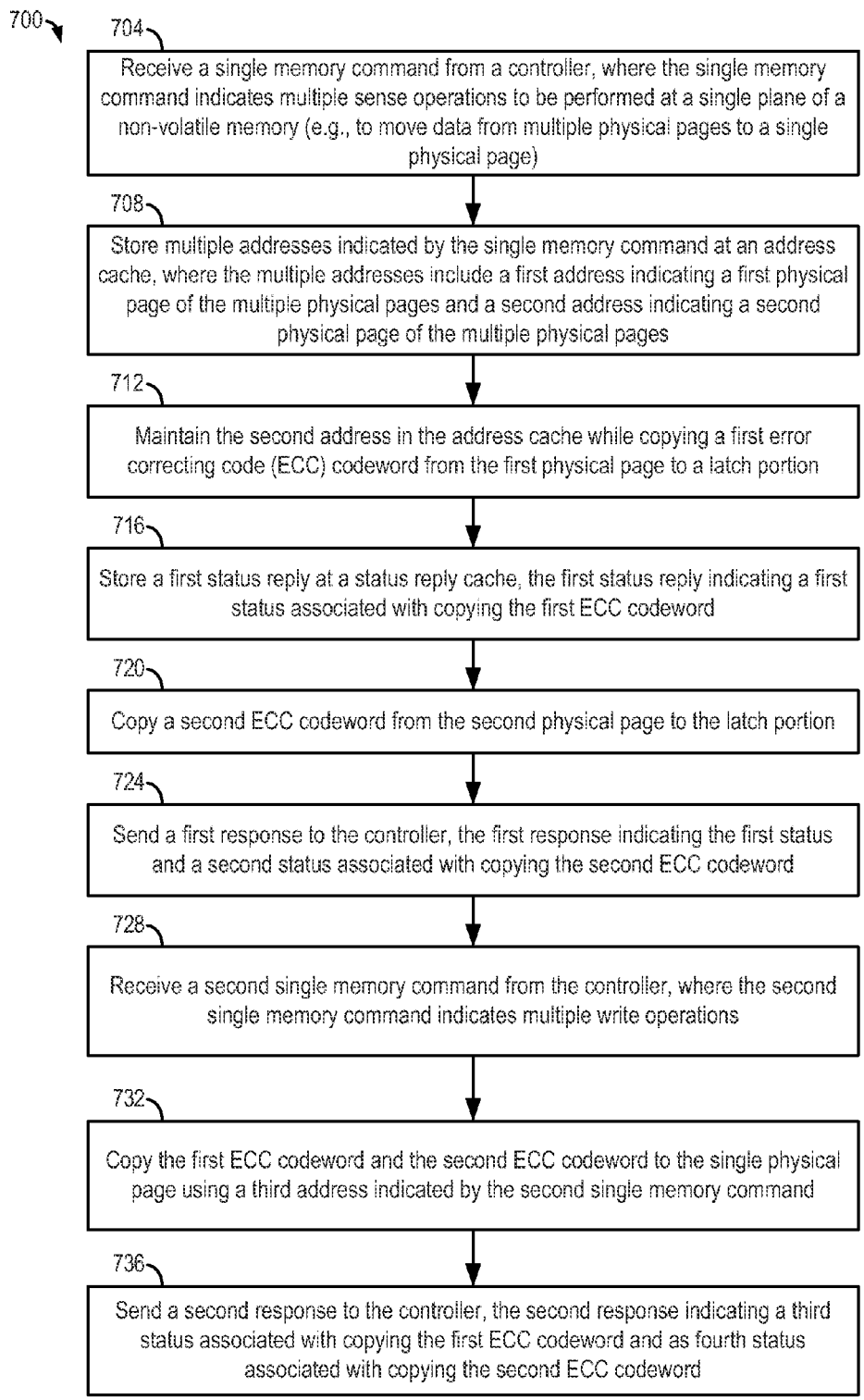
FIG. 7 is a flow diagram of a particular illustrative embodiment of another method of operation of the data storage device of FIG. 1.

Referring to FIG. 7 a particular illustrative embodiment of a method is depicted and generally designated 700. The method 700 may be performed by the data storage device 102, such as by the non-volatile memory 104. In a particular embodiment, the method 700 is performed at one or more of the dies 106, 128. The method 700 may be performed using the single memory commands 132, 204 and the responses 202, 302. In a particular embodiment, the method 700 is performed when a number of communications at the shared bus 130 during a particular time interval does not satisfy a threshold and/or when an available storage space at the address cache 108 and/or the status reply cache 110 does not satisfy a threshold.

The method 700 may include receiving a single memory command from a controller, at 704. The controller may correspond to the controller 134. The single memory command may correspond to the single memory command 132. The single memory command indicates multiple sense operations to be performed at a single plane of the non-volatile memory 104 (e.g., to initiate a fold operation to move data from multiple physical pages to a single physical page). For example, a fold operation may move the ECC codewords 118, 120 from the physical pages 114, 116 to the physical page 126.

The method 700 may further include storing multiple addresses indicated by the single memory command at an address cache, at 708. The address cache may correspond to the address cache 108. The multiple addresses include a first address indicating a first physical page of the multiple physical pages and a second address indicating a second physical page of the multiple pages. The first address may correspond to the address 410, and the second address may correspond to the address 412.

The method 700 may further include maintaining the second address in the address cache while copying a first ECC codeword from the first physical page to a latch portion, at 712. The first ECC codeword may correspond to the ECC codeword 118, and the latch portion may correspond to the latch portion 122.

The method 700 may further include storing a first status reply at a status reply cache, at 716. The first status reply indicates a first status associated with copying the first ECC codeword to the latch portion. The status reply cache may correspond to the status reply cache 110.

The method 700 may further include copying a second ECC codeword from the second physical page to the latch portion, at 720. The second ECC codeword may correspond to the ECC codeword 120.

The method 700 may further include sending a first response to the controller, at 724. The first response indicates the first status and a second status associated with copying the ECC codeword. The first response may correspond to the response 202. The first response may include the status replies 418, 420. The first status may be indicated by the status reply 418, and the second status may be indicated by the status reply 420.

The method 700 may further include receiving a second single memory command from the controller, at 728. The second single memory command may correspond to the single memory command 204. The second single memory command indicates multiple write operations to be performed (e.g., to complete the fold operation). For example, the second single memory command may instruct the non-volatile memory 104 to copy the ECC codewords 118, 120 from the latch portion 122 to the physical page 126 to complete the fold operation.

The method 700 may further include copying the first ECC codeword and the second ECC codeword to the single physical page using a third address indicated by the second single memory command, at 732. The third address may correspond to an address of the physical page 126 indicated by the single memory command 204.

The method 700 may further include sending a second response to the controller, at 736. The second response may indicate a third status associated with copying the first ECC codeword to the single physical page and a fourth status associated with the second ECC codeword to the single physical page (e.g., pass or fail statuses). The second response may correspond to the response 302. In a particular embodiment, the response 302 indicates the third status and the fourth status. The status reply 436 may indicate the third status, and the status reply 438 may indicate the fourth status.

The method 700 of FIG. 7 improves operation of the non-volatile memory 104. For example, by storing the first status reply at the address cache, the die 106 may postpone sending the first status reply to the controller 134 via the shared bus 130. The die 106 may send the first response indicating both the first status and the second status, reducing congestion at the shared bus 130.

Figure 8:
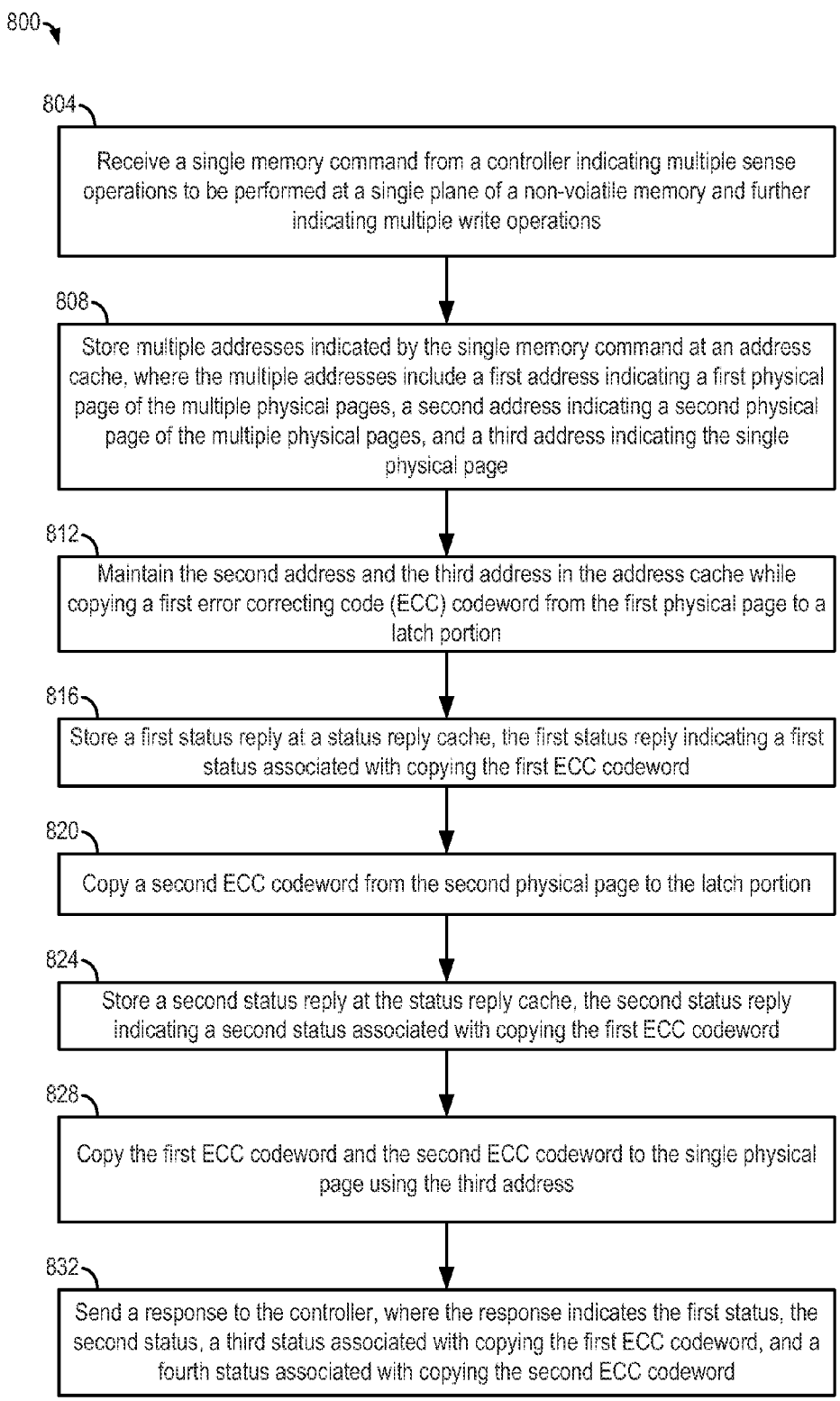
FIG. 8 is a flow diagram of a particular illustrative embodiment of another method of operation of the data storage device of FIG. 1.

Referring to FIG. 8, a particular illustrative embodiment of a method is depicted and generally designated 800. The method 800 may be performed by the data storage device 102, such as by the non-volatile memory 104. In a particular embodiment, the method 800 is performed at one or more of the dies 106, 128. The method 800 may be performed using the single memory command 422 and the response 434. The method 800 may be performed when traffic at the shared bus 130 during a particular time interval satisfies a threshold and/or when an available storage space at the address cache 108 and/or the status reply cache 110 satisfies a threshold.

The method 800 may include receiving a single memory command from a controller, at 804. The controller may correspond to the controller 134. The single memory command may correspond to the single memory command 422. The single memory command may indicate multiple sense operations to be performed at a single plane of the non-volatile memory 104 (e.g., to initiate a fold operation) and may further indicate multiple write operations (e.g., to complete the fold operation). For example, the multiple sense operations may copy data from the SLC portion 112 to the latch portion 122, and the multiple write operations may copy the data from the latch portion 122 to the MLC portion 124. The data may include the ECC codewords 118, 120. The data may be copied from multiple physical pages of the SLC portion 112 to the latch portion 122, and from the latch portion 122 to a single physical page of the MLC portion 124.

The method 800 may further include storing multiple addresses indicated by the single memory command at an address cache, at 808. The address cache may correspond to the address cache 108. The multiple addresses may include a first address indicating a first physical page of the multiple physical pages, a second address indicating a second physical page of the multiple physical pages, and a third address indicating the single physical page. The single physical page may correspond to the physical page 126. The multiple physical pages may correspond to the physical pages 114, 116. In a particular embodiment, the first address corresponds to the address 410, the second address corresponds to the address 412, and the third address corresponds to the address 430.

The method 800 may further include maintaining the second address and the third address in the address cache while copying a first ECC codeword from the first physical page to a latch portion, at 812. The latch portion may correspond to the latch portion 122. The first ECC codeword may correspond to the ECC codeword 118.

The method 800 may further include storing a first status reply at a status reply cache, at 816. The first status reply indicates a first status associated with copying the first ECC codeword. The status reply cache may correspond to the status reply cache 110. The first status reply may correspond to the status reply 418.

The method 800 may further include copying a second ECC codeword from the second physical page to the latch portion, at 820. For example, the ECC codeword 120 may be copied from the physical page 116 to the latch portion 122.

The method 800 may further include storing a second status reply at the status reply cache, at 824. The second status reply indicates a second status associated with copying the first ECC codeword. In a particular embodiment, the second status reply corresponds to the status reply 420.

The method 800 may further include copying the first ECC codeword and the second ECC codeword to the single physical page using a third address indicated by the single memory command, at 828. For example, the ECC codewords 118, 120 may be copied from the latch portion 122 to the physical page 126. The third address may be accessed from the address cache 108.

The method 800 may further include sending a response to the controller, at 832. The response may correspond to the response 434. The response indicates the first status, the second status, a third status associated with copying the first ECC codeword to the single physical page, and a fourth status associated with copying the second ECC codeword to the single physical page. For example, the response may include the status replies 418, 420, 436, and 438. The status replies 418, 420, 436, 438 may indicate the first status, the second status, the third status, and the fourth status, respectively. The status replies 418, 420, 436, and 438 may be stored at the status reply cache 110 until the response is sent to the controller.

The method 800 of FIG. 8 enables reduced traffic and congestion at a shared resource, such as the shared bus 130. For example, because the method 800 of FIG. 8 enables an operation, such as a fold operation, to be performed using a single memory command and a single response, the shared bus 130 is less congested and is therefore more available for interactions of other components of the electronic device 100. For example, the die 128 may interact with the controller 134 (or vice versa) during times at which a conventional device would otherwise send multiple sense commands, multiple status replies for the multiple sense commands, multiple write commands, and multiple status replies for the write commands. Accordingly, performance of the data storage device 102 is improved.

As used herein, a "sense command" refers to a command to read or copy data from a memory array into one or more latches. For example, a sense command may command the non-volatile memory 104 to read or copy data from a single physical page, such as one of the physical pages 114, 116, to the latch portion 122. As used herein, a "sense operation" refers to an operation that reads or copies data from a memory array into one or more latches. For example, the non-volatile memory 104 may perform a sense operation to read or copy data from a single physical page, such as one of the physical pages 114, 116, to the latch portion 122. The non-volatile memory 104 may perform a sense operation in response to a sense command from the controller 134. To further illustrate, the non-volatile memory 104 may read data stored at the MLC portion 124 into one or more latches, such as by performing multiple voltage comparisons to read data from each storage element of a single physical page of the MLC portion 124 (e.g., in connection with an "X2" or an "X3" configuration). As used herein, performing multiple voltage comparisons to read data from each storage element of a single physical page of the MLC portion 124 into one or more latches is considered a single sense operation (as opposed to multiple sense operations). That is, performing multiple voltage comparisons to read data from a physical page of the MLC portion 124 into one or more latches (e.g., in connection with an "X2" or an "X3" technique) is considered a single sense operation.

Although certain operations have been described herein with reference to the die 106, it should be appreciated that one or more techniques illustrated herein may be applied to other portions of the non-volatile memory 104, including one or more dies alternatively or in addition to the die 106. As an example, the controller 134 may perform one or more operations with respect to the die 106 while performing one or more operations with respect to the die 128. As a particular example, if an available space of the address cache 108 and the status reply cache 110 does not satisfy a threshold, and if an available storage space of one or more caches of the die 128 satisfies a threshold, then a first fold operation may be performed with respect to the die 106 in a manner illustrated by the methods 500, 700, and a second fold operation may be performed with respect to the die 128 in a manner illustrated by the methods 600, 800. In a particular embodiment, because techniques described herein may reduce traffic at the shared bus 130, the first fold operation and the second fold operation may be performed concurrently or approximately concurrently, since for example a number of communications at the shared bus 130 is reduced and may enable greater throughput of communications between the controller 134 and the dies 106, 128.

As used herein, a "fold operation" may include any operation that copies, moves, and/or relocates data from multiple pages to a physical page. As an example, a fold operation may include copying, moving, and/or relocating multiple logical pages, such as ECC codewords, to a physical page. A fold operation may be initiated by the controller 134 using a command that senses data, such as a command to sense multiple logical pages stored at the non-volatile memory 104. Further, a fold operation may encompass one or more operations not explicitly described herein. To illustrate, although a fold operation is described herein with reference to the die 106, it should be appreciated that a fold operation may include sensing data from multiple dies (e.g., the dies 106, 128) and writing the data to a single physical page (e.g., the physical page 126, or another physical page). Those of skill in the art will recognize that other similar operations are within the scope of the present disclosure.

Although one or more components described herein are illustrated as block components and described in general terms, such components may include one or more microprocessors, state machines, or other circuits configured to enable the controller 134 (or one or more components thereof) to perform operations described herein. For example, one or more components described may correspond to one or more physical components, such as hardware controllers, state machines, logic circuits, one or more other structures, or a combination thereof, to enable the controller 134 to perform one or more operations described herein. One or more aspects of the data storage device 102 may be implemented using a microprocessor or microcontroller programmed to perform operations described herein, such as operations corresponding to the methods 400, 500, 600, 700, and 800. In a particular embodiment, the controller 134 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, a processor of the controller 134 execute instructions to send a single memory command (e.g., the single memory command 132 or the single memory command 422) from the controller 134 to the non-volatile memory 104. For example, the processor may execute a write instruction that causes the controller 134 to send a write command to the non-volatile memory 104 via the shared bus 130. The processor may correspond to the batch command issuer 138. The single memory command indicates multiple sense operations to be performed at a single plane of the non-volatile memory 104. In a particular embodiment, a fold operation to move data from multiple physical pages of the non-volatile memory to a single physical page of the non-volatile memory is initiated by sensing the data via the multiple sense operations. The data may correspond to the ECC codewords 118, 120. The single physical page may correspond to the physical page 126, and the multiple physical pages may correspond to the physical pages 114, 116.

In a particular embodiment, the data storage device 102 may be embedded within or attached to one or more host devices, such as within a housing of a host communication device, which may correspond to the host device 144. For example, the data storage device 102 may be integrated within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 144.

To further illustrate, the data storage device 102 may be configured to be coupled to the host device 144 as embedded memory, such as in connection with eMMC® (trademark of Joint Electron Devices Engineering Council (JEDEC) Solid State Technology Association, Arlington, Va.) and eSD configurations, as illustrative examples. To illustrate, the data storage device 102 may correspond to an eMMC device. As another example, the data storage device 102 may correspond to a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

In a particular embodiment, the data storage device 102 includes a non-volatile memory, such as a three-dimensional (3D) memory, a flash memory (e.g., NAND, NOR, multi-level cell (MLC)), a divided bit-line NOR (DINOR) memory, an AND memory, a high capacitive coupling ratio (HiCR) device, an asymmetrical contactless transistor (ACT) device, or other flash memories), an erasable programmable read-only memory (EPROM), an electrically-erasable programmable read-only memory (EEPROM), a read-only memory (ROM), a one-time programmable memory (OTP), another type of memory, such as a resistive random access memory (ReRAM), or a combination thereof. Alternatively or in addition, the data storage device 102 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory; and
a controller coupled to the non-volatile memory, wherein the controller is configured to send a single memory command to the non-volatile memory, and wherein the single memory command initiates multiple sense operations to be performed at addresses in a single plane of the non-volatile memory, the addresses including at least first and second addresses associated with first and second storage elements, respectively.

2. The data storage device of claim 1, wherein sense operations are to be performed at multiple physical pages of the single plane, and wherein the first and second addresses are associated with a first and second physical pages of the multiple physical pages.

3. The data storage device of claim 1, wherein the non-volatile memory includes an address cache configured to store the first and second addresses.

4. The data storage device of claim 3, wherein the non-volatile memory further includes a latch portion, and wherein the non-volatile memory is configured to maintain the second address in the address cache while copying sensed data corresponding to a first error correcting code (ECC) codeword read from a physical page to the latch portion.

5. The data storage device of claim 1, wherein the single memory command further initiates multiple write operations to be performed at a single physical page of the non-volatile memory, and wherein the single memory command further indicates a third address associated with the single physical page.

6. The data storage device of claim 5, wherein the non-volatile memory is further configured to store the third address in an address cache prior to copying a first error correcting code (ECC) codeword to a latch portion and to maintain the third address in the address cache while copying sensed data corresponding to a second ECC codeword read from a second physical page to the latch portion.

7. The data storage device of claim 6, wherein the non-volatile memory is further configured to access the third address from the address cache upon copying the second ECC codeword to the latch portion and to write the first ECC codeword and the second ECC codeword to the single physical page based on the third address.

8. The data storage device of claim 7, wherein the controller is further configured to receive a response from the non-volatile memory, and wherein the response indicates a pass or fail status of the multiple sense operations and further indicates a pass or fail status of the multiple write operations.

9. The data storage device of claim 8, wherein the non-volatile memory includes a status reply cache that is configured to store status replies associated with the multiple sense operations and with the multiple write operations, and wherein the response includes the status replies.

10. The data storage device of claim 1, wherein the non-volatile memory includes a first die and a second die, and further comprising a shared bus that couples the controller to the first die and the second die, wherein the single memory command reduces traffic on the shared bus.

11. The data storage device of claim 1, wherein the non-volatile memory is a three-dimensional (3D) memory, and further comprising circuitry associated with operation of memory cells of the 3D memory.

12. A method comprising:
in a data storage device including a non-volatile memory and a controller, performing:

sending a single memory command from the controller to the non-volatile memory, wherein the single memory command initiates multiple sense operations to be performed at addresses in a single plane of the non-volatile memory, the addresses including at least first and second addresses associated with first and second storage elements, respectively.

13. The method of claim 12, wherein the data storage device performs a fold operation to move data from multiple physical pages of the non-volatile memory to a single physical page of the non-volatile memory by sensing the data via the multiple sense operations.

14. The method of claim 13, wherein the data includes multiple error correcting code (ECC) codewords stored at the non-volatile memory, wherein the multiple ECC codewords are sensed from a single-level cell (SLC) portion of the non-volatile memory, and wherein the SLC portion includes the multiple physical pages.

15. The method of claim 12, wherein the single memory command further initiates multiple write operations to be performed at the non-volatile memory.

16. The method of claim 15, wherein the single memory command includes a terminator opcode indicating an end of the single memory command.

17. The method of claim 12, wherein the single memory command includes multiple addresses associated with the multiple sense operations.

18. A device comprising:

a non-volatile memory; and a controller coupled to the non-volatile memory, wherein the controller is configured to:

send a single memory command to the non-volatile memory, wherein the single memory command initiates multiple sense operations and multiple write operations to be performed at a plane of the non-volatile memory; and receive a response from the non-volatile memory, wherein the response indicates a pass status of the multiple sense operations and further indicates performing the multiple write operations.

19. The device of claim 18, wherein the non-volatile memory comprises a three-dimensional (3D) memory, and wherein the device includes circuitry associated with operation of memory cells of the 3D memory.

* * * * *